(12) United States Patent  
McKenney et al.

(10) Patent No.: US 9,128,679 B2  
(45) Date of Patent: Sep. 8, 2015

(54) SLOT AND MEMORY MODULE FOR A SLOT STANDING INTERCONNECT

(75) Inventors: Darryl J. McKenney, Londonderry, NH (US); Daniel Toohey, South Grafton, MA (US); Stephen Mariani, Randolph, MA (US); Michael Gust, Westford, MA (US); Absu Methratta, Waltham, MA (US); Timothy Fleury, Princeton, MA (US); Steven Imperalli, Townsend, MA (US)

(73) Assignee: MERCURY COMPUTER SYSTEMS, INC., Chelmsford, MA (US)

( * ) Notice: Subject to any disclaimer, the term of this patent is extended or adjusted under 35 U.S.C. 154(b) by 319 days.

(21) Appl. No.: 13/600,810

(22) Filed: Aug. 31, 2012

(65) Prior Publication Data

US 2013/0058050 A1 Mar. 7, 2013

Related U.S. Application Data

(60) Provisional application No. 61/530,169, filed on Sep. 1, 2011.

(51) Int. Cl.
*H05K 1/14* (2006.01)
*G06F 1/18* (2006.01)
(Continued)

(52) U.S. Cl.
CPC ............... *G06F 1/185* (2013.01); *H01R 12/52* (2013.01); *H05K 3/403* (2013.01); *B23C 2220/36* (2013.01); *H05K 1/11* (2013.01); *H05K 3/34* (2013.01); *H05K 3/366* (2013.01); *H05K 2201/09036* (2013.01); *H05K 2201/09181* (2013.01); *H05K 2201/09645* (2013.01); *H05K 2201/10159* (2013.01); *H05K 2203/0228* (2013.01); *Y10T 29/4913* (2015.01); *Y10T 29/49124* (2015.01); *Y10T 29/49144* (2015.01); *Y10T 409/303752* (2015.01)

(58) Field of Classification Search
USPC .................................... 361/785, 728; 174/261
See application file for complete search history.

(56) References Cited

U.S. PATENT DOCUMENTS 2,825,037 A 2/1958 French
5,276,817 A * 1/1994 Matschke et al. ............... 439/61
(Continued)

OTHER PUBLICATIONS

International Search Report and Written Opinion for Application No. PCT/US2012/053647, 8 pages, dated Apr. 29, 2013.
(Continued)

*Primary Examiner* — Andargie M Aychillhum
(74) *Attorney, Agent, or Firm* — Nelson Mullins Riley & Scarborough LLP

(57) ABSTRACT

According to exemplary embodiments, a controlled-depth slot extending into a circuit board is provided. The controlled depth slot may be milled, and may comprise ½ radial plated through-holes to generate a solderable "D" interconnect feature. The slot may include interconnect features on one to five sides. According to another exemplary embodiment, a circuit board having a depth-controlled interconnect slot is provided in conjunction with one or more solderable technology modules. The one or more solderable technology modules may include memory devices, power devices such as Point of Load Supplies (POLS), security devices and anti-tamper devices, capacitance devices, and other types of chips such as Field Programmable Gate Arrays (FPGAs). The solderable technology modules may be soldered into the slot to secure the modules in the slot and connect the modules to interconnects on the circuit board.

16 Claims, 23 Drawing Sheets

(51) Int. Cl.
  *H01R 12/52* (2011.01)
  *H05K 3/40* (2006.01)
  *H05K 1/11* (2006.01)
  *H05K 3/34* (2006.01)
  *H05K 3/36* (2006.01)

(56) References Cited

U.S. PATENT DOCUMENTS 5,581,877 A * 12/1996 Woychik et al. ............ 29/852
6,639,806 B1 10/2003 Chuang et al.
2003/0231476 A1 12/2003 Vinson et al.
2012/0106113 A1* 5/2012 Kirmayer .................. 361/784

OTHER PUBLICATIONS

International Preliminary Report on Patentability and Written Opinion for Application No. PCT/US2012/053647, 6 pages, dated Mar. 4, 2014.

European Office Action, EP12772567.9-1959, dated Apr. 7, 2015, pp. 1-5.

* cited by examiner

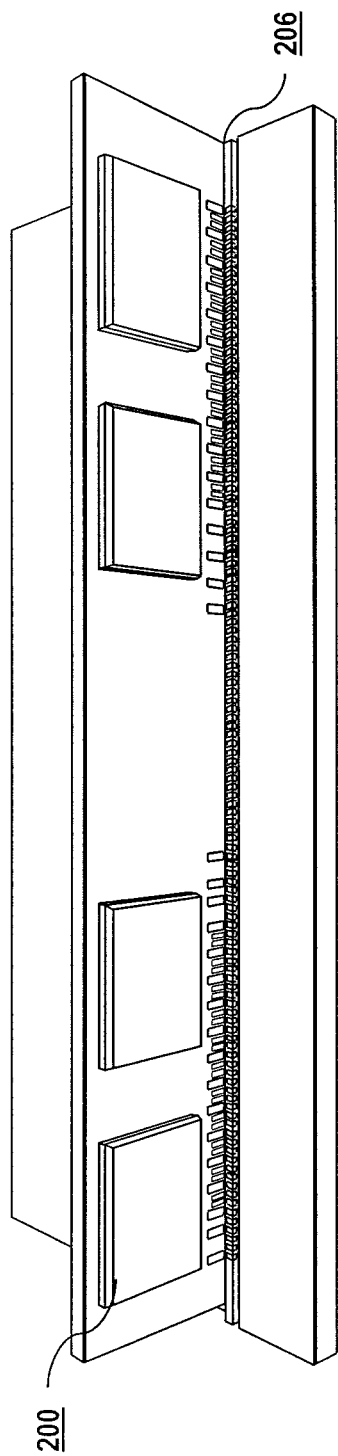

240 Pin SSI Slot

Solder Mask:

Paste Mask:

SLOT AND MEMORY MODULE FOR A SLOT STANDING INTERCONNECT

RELATED APPLICATIONS

The present application claims priority to U.S. Provisional Application No. 61/530,169, filed Sep. 1, 2011 and entitled "Slot and Memory Module for a Slot Standing Interconnect." The contents of the aforementioned application are incorporated herein by reference.

BACKGROUND

The present application pertains to the design and manufacture of circuit boards, and more specifically the connection of devices such as memory modules to circuit boards.

Conventionally, as shown in FIGS. 1A and 1B, a memory device 100 may have a number of pins 102 for transferring information from the memory device 100 to a circuit board 104. The memory device 100 connects to the circuit board 104 via a slot 106 that extends from the circuit board 104 and is fixed to the circuit board 104.

The conventional slot 106 is external to the circuit board 104. That is, on the circuit board 104, the slot 106 is provided in a protrusion that attaches to the circuit board 104 and rises from the surface of the circuit board 104. The memory device 100 sits inside the slot 106 and is supported on its sides by the external protrusion.

The conventional memory device 100 is positioned in the slot 106 by pushing the memory module 100 into the slot 106 so that the pins 102 make contact with corresponding interconnects in the slot 106. Once the memory device 100 is seated in the slot 106, the memory device 100 is held in place by friction and may be further secured by actuating one or more clips 108, which lock the memory device 100 into position in the slot 106.

This conventional approach suffers from a number of drawbacks. For example, due to the above-described method of securing the memory device 100 in the slot 106, problems such as fretting are common. Fretting refers to the wear between two surfaces that are in contact with each other under a load. When the two surfaces grind against each other, one or both of the surfaces can wear away. In the case of a memory device 100 connected to a circuit board 104 via pins 102 and interconnects, fretting may cause the pins 102 and interconnects to wear away. Thus, some information that is intended to be transferred between the memory device 100 and the circuit board 104 may be unable to be transferred due to the absence of a suitable pathway for the information.

Due to the presence of fretting, among other problems, the connection of the memory device 100 to the board 104 is not rugged. Both the memory device 100 and the board 104 are therefore subject to wear and premature failure.

Fretting is particularly prevalent in the presence of vibration, which is a normal occurrence even on stationary circuit boards. Fretting may become a bigger problem in the presence of a high-vibration environment, such as a circuit board mounted in the head of a missile or on a moving vehicle.

Furthermore, the conventional slot 106 takes up space on the circuit board 104 beyond the dimensions of the memory device 100. Therefore, the circuit board 104 is larger in length and width (i.e., the x-axis and the y-axis of the board) than might otherwise be necessary in order to accommodate the length and width of the memory device 100. Moreover, because the slot 106 extends upward from the circuit board 104 (i.e., along the z-axis of the board), the circuit board 104, when deployed in conjunction with one or more memory devices 100, is taller than might otherwise be necessary in order to accommodate the height of the memory device 100. This limits the number of circuit boards 104 that can be stacked in a given space, which in turn limits the computing power of a system employing such circuit boards 104.

SUMMARY

A circuit board having an internal slot milled to a controlled depth is provided. A technology module, such as a memory device is provided in the controlled depth slot and secured by an adhesive (e.g., by soldering the memory device into place). In order to facilitate application of the adhesive to the memory device, the controlled depth slot may be provided with a number of semicircular interconnect features, which receive the adhesive and/or guide the adhesive into place.

Therefore, the memory device can be secured in a way that reduces vibration issues such as fretting. Accordingly, the circuit board and memory device can be made rugged. Furthermore, because the slot is internal to the circuit board, and because it is not necessary to secure the memory device with clips, the dimensions of the circuit board in each direction (e.g., X-axis, Y-axis, and Z-axis) can be reduced.

For example, according to exemplary embodiments, a controlled-depth slot is provided in a circuit board. The circuit board may be a printed circuit board.

The controlled depth slot may extend into the circuit board a portion of a depth of the circuit board. The controlled depth slot may be milled into the circuit board. The slot may be, for example, 0.010 inches to 0.250 inches wide, and may be 0.005 inches to 0.125 inches deep.

The controlled-depth slot may comprise ½ radial plated through-holes to generate one or more solderable ½ radial (e.g., in the shape of a "D") interconnect features. The slot may include 2 to 3000 ½ radial interconnect features. The slot may include interconnect features on 1 to 5 sides, including the bottom of the slot, and preferably includes interconnect features on 3 to 4 sides. Each of the ½ radial interconnect features may have a radius, and at least 2 of the ½ radial interconnect features may have different radiuses. An adhesive such as solder may be provided to the one or more ½ radial interconnect features.

According to another exemplary embodiment, a system including a circuit board having a depth-controlled interconnect slot and one or more solderable technology modules is provided. The slot may be internal to the circuit board, and may include one or more ½ radial interconnect features on 1-5 sides of the slot. A solderable technology module may be provided in the slot The solderable technology module may be, for example, a memory device, a power device such as Point of Load Supplies (POLS), a security device or anti-tamper device, a capacitance device, or other types of devices such as Field Programmable Gate Arrays (FPGAs). In the case of a memory module, the memory module may include 1 GB to 1000 GB of memory. The module may be provided with anti-tamper security features. The module may be 0.010 inches to 0.125 inches thick.

The module may include 2 to 3000 solderable fingers. The fingers may include a flat face for receiving solder. The fingers may include tin-lead, and may be soldered into the slot using tin-lead solder.

According to another exemplary embodiment, a method of producing a circuit board and technology module system is provided.

The method may include generating a slot in the circuit board. The slot may be generated by milling the slot into the circuit board to a controlled depth. The slot may extend a portion of the depth of the circuit board. For example, the slot may extend at most ½ of a depth of the circuit board. If the circuit board includes 24 layers, in some embodiments the slot may extend to at most the $12^{th}$ layer. The slot may be 0.010 inches to 0.250 inches wide and may extend 0.005 inches to 0.125 inches into the circuit board.

The method may further include generating one or more ½ radial interconnect features on at least one side of the slot. The ½ radial interconnect features may be provided on 3-4 sides of the slot, and may further be provided on the bottom of the slot. The step of generating the one or more ½ radial interconnect features may include generating 2 to 3000 radial interconnect features.

The method may further include providing one or more interconnects on the circuit board connected to the one or more ½ radial interconnect features.

The method may further include inserting a technology module into the slot. For example, the technology module may be a memory module.

The technology module may be secured in a slot of the circuit board. For example, the technology module may be secured in the slot by providing an adhesive to the one or more ½ radial interconnect features of the slot to secure the module in the slot. The adhesive may be solder.

The slot may be entirely internal to the circuit board such that no portion of the apparatus for connecting the technology module to the circuit board extends above a primary surface of the circuit board.

BRIEF DESCRIPTION OF THE DRAWINGS

Exemplary embodiments of the present invention will be described in detail below with reference to the following figures.

FIG. 2 depicts a solderable memory module suitable for use with the present invention.

DETAILED DESCRIPTION

According to exemplary embodiments, a controlled-depth slot extending into a circuit board is provided. The controlled depth slot may be milled, and may comprise ½ radial plated through-holes to generate a solderable "D" interconnect feature. The slot may include interconnect features on one to five sides. According to another exemplary embodiment, a circuit board having a depth-controlled interconnect slot is provided in conjunction with one or more solderable technology modules. The one or more solderable technology modules may include memory devices, power devices such as Point of Load Supplies (POLS), security devices and anti-tamper devices, capacitance devices, and other types of chips such as Field Programmable Gate Arrays (FPGAs). The solderable technology modules may be soldered into the slot to secure the modules in the slot and connect the modules to interconnects on the circuit board.

Using the slot, system, and methods described herein, a rugged circuit board assembly including one or more secured technology modules may be created. The rugged circuit board may exhibit an increased service life due to a reduction in fretting on the technology modules, and further may exhibit reduced dimensions. The reduced dimensions may allow the circuit board to be provided in a smaller casing, thereby reducing the overall dimensions of the system in which the circuit board is employed, and/or may allow for more circuit boards to be stacked in the same amount of space.

According to exemplary embodiments, a controlled-depth slot is provided in a circuit board. A technology module, such as the solderable memory module 200 of FIG. 2A, may be secured in the controlled-depth slot, such as the controlled-depth slot of FIG. 2B.

Figure 1A:
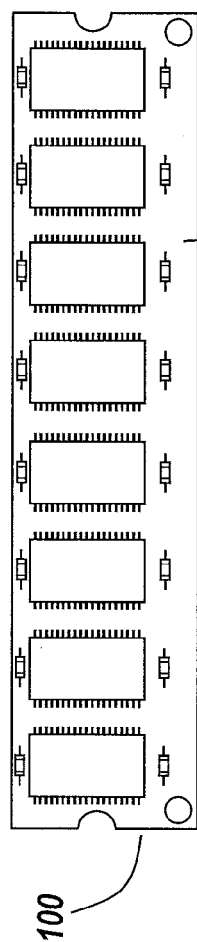
FIG. 1A depicts a conventional memory module.
Figure 1B:
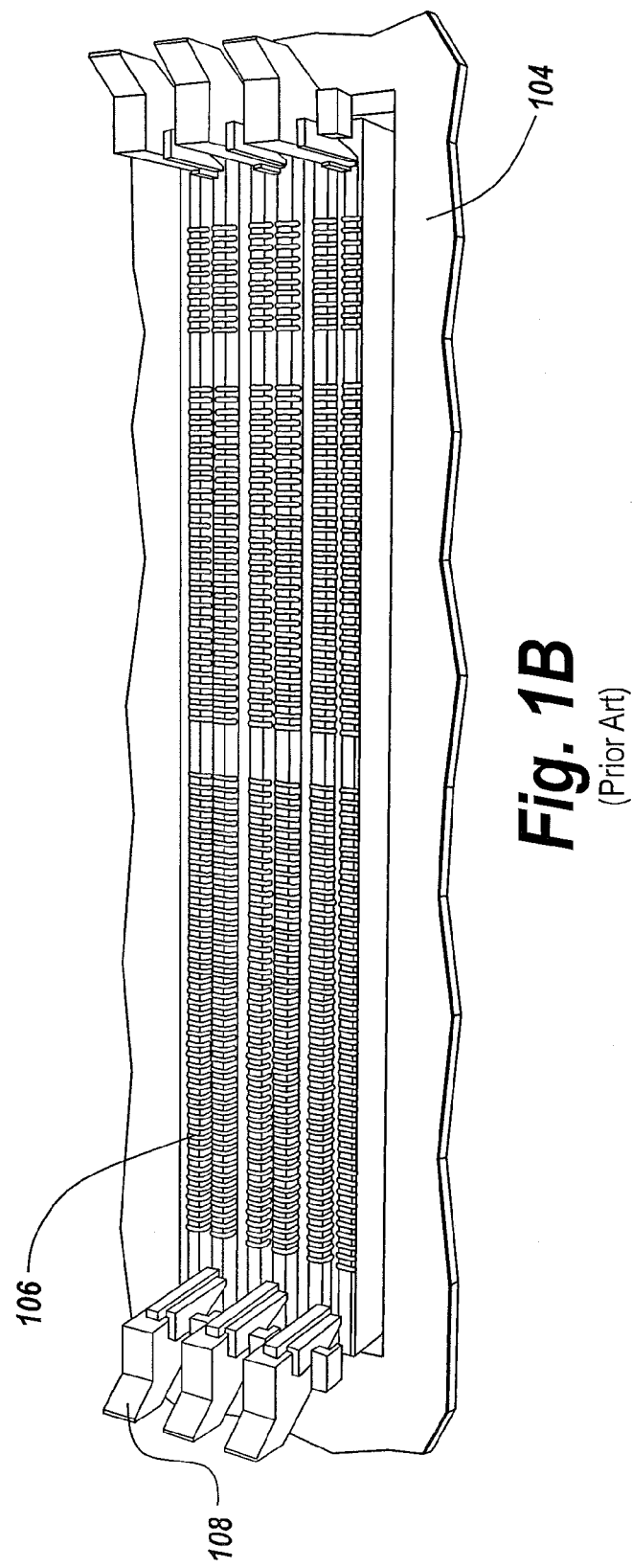
FIG. 1B depicts a conventional apparatus for securing the conventional memory module of FIG. 1A to a circuit board.

In brief summary, FIG. 2 depicts a solderable memory module 200 suitable for use with the present invention. As can be seen in FIG. 2, the solderable memory module 200 is secured directly to the board without the use of a separate fastening apparatus such as the external slot 106 and clips 108 of FIG. 1B. The solderable memory module 200 will be described in detail with respect to FIGS. 18-24. The solderable memory module 200 is secured to the board using an internal slot 206. The slot 206 is described in detail below with respect to FIGS. 3A through 16.

Figure 3A:
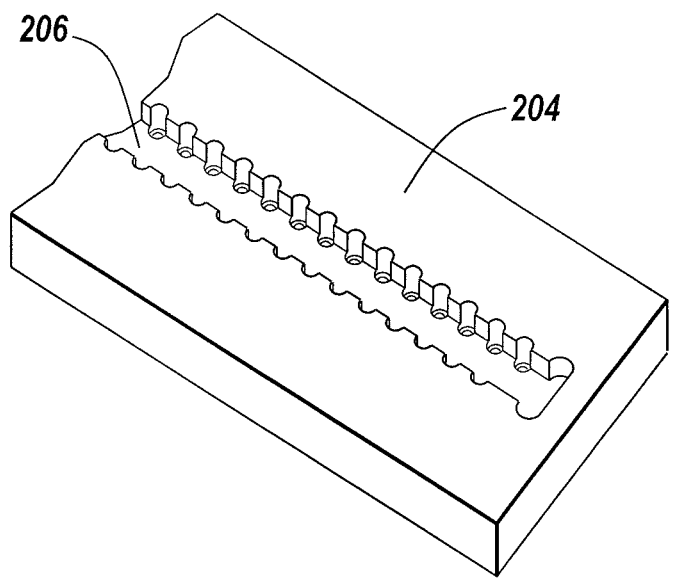
FIGS. 3A and 3B depict detailed views of a slot according to exemplary embodiments of the present invention.
Figure 3B:
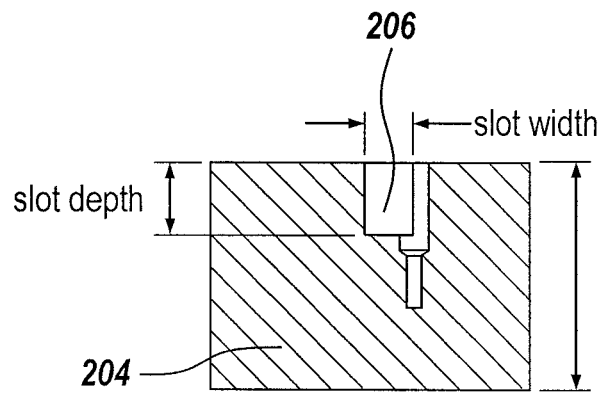

FIGS. 3A and 3B depict detailed views of a slot according to exemplary embodiments of the present invention. As shown in FIG. 3A, the slot 206 is a recessed portion of the circuit board 204. Thus, the slot 206 may be entirely internal to the circuit board such that no portion or only a non-substantial portion of the apparatus for connecting the technology module to the circuit board extends above a primary surface of the circuit board. The controlled depth slot 206 may be milled into the circuit board using known milling techniques.

The slot 206 may be 0.010 inches to 0.250 inches wide, and as shown in FIG. 3B preferably may be approximately 0.0410 inches wide. The width of the slot 206 may depend on the width of the technology module which is to be seated in the slot 206.

The slot 206 may be 0.005 inches to 0.125 inches deep, and preferably (as shown in FIG. 3B) is 0.0300+/−0.0050 inches deep. The depth of the slot 206 may depend on a number of factors, such as the height, length, and/or width of the technology module deployed in the slot 206, whether interconnects are provided along the bottom of the slot 206, the depth of the circuit board 204, the configuration of any layers making up the circuit board 204, the strength of the adhesive used to secure the technology module in the slot 206, and other factors.

Figure 4:
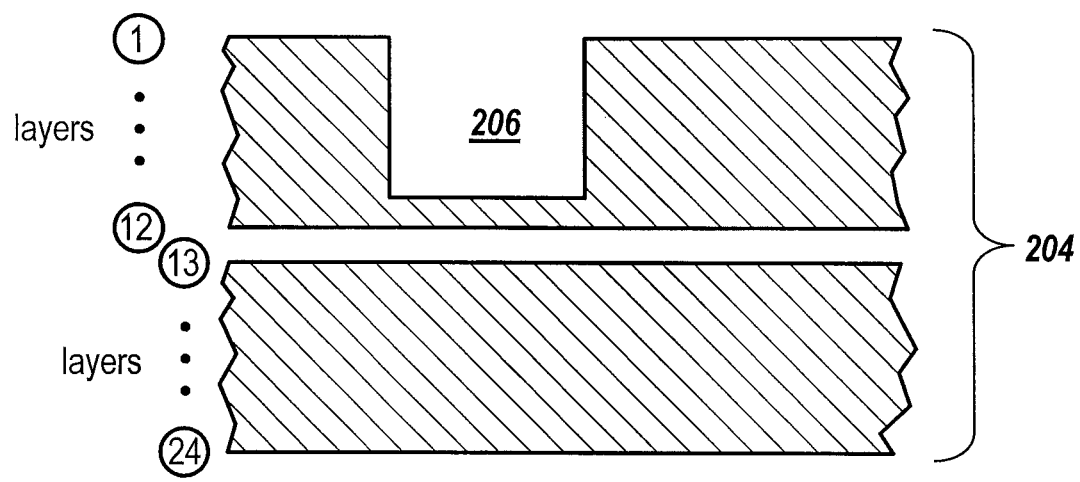
FIG. 4 depicts exemplary depths in a circuit board for a slot according to exemplary embodiments of the present invention.

FIG. 4 depicts exemplary depths in a circuit board 204 for a slot 206 according to exemplary embodiments of the present invention. As shown in FIG. 4, the slot 206 may preferably extend into a circuit board 204 a portion of a depth of the circuit board 204, but not entirely through the circuit board 204. In other embodiments, the slot 206 may extend entirely through the circuit board 204.

Figure 5:
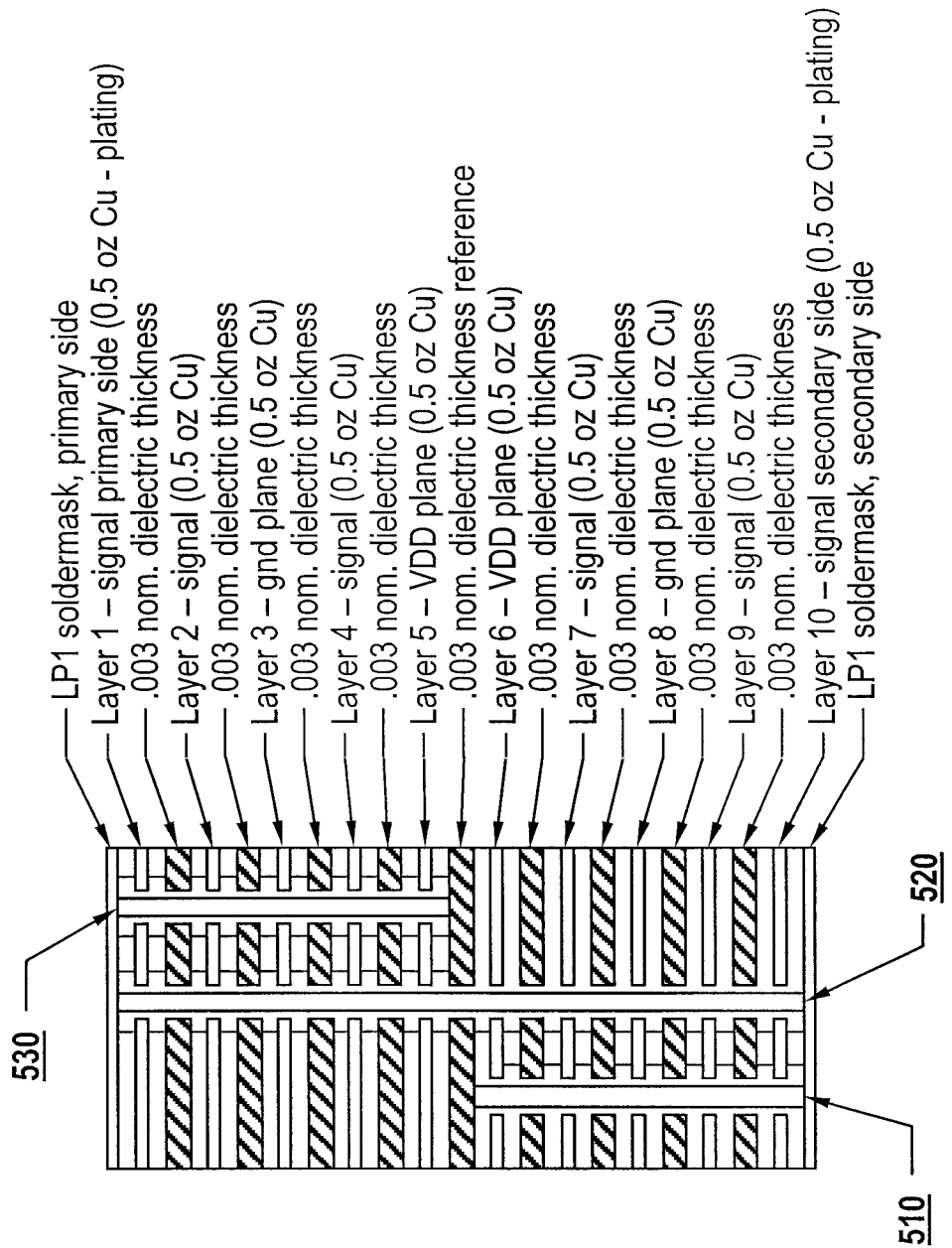
FIG. 5 is a fabrication plan depicting a cross-section of a portion of a printed circuit board suitable for use with exemplary embodiments of the present invention.

In some embodiments, the slot 206 may extend up to halfway through the depth of the circuit board 204. For example, a circuit board may be formed from a number of discrete layers stacked one on top of the other. If the circuit board 204 includes one or more layers (as shown in FIGS. 4 and 5), the slot 206 may extend through up to half of the layers. In the example depicted in FIG. 4, the circuit board 204 includes 24 layers, and the slot extends through the topmost twelve layers. Because the slot 206 does not pass all the way through the circuit board 204, the bottom twelve layers of the circuit board 204 are advantageously retained for routing information through the bottom twelve layers, allowing the technology module to be seated in the slot 206 while leaving the bottom twelve layers of the circuit board 204 intact for other functions.

FIG. 5 depicts three examples of controlled-depth slots. A first controlled-depth slot 510 extends only through the bottom half of the board (e.g., in a board with 10 layers, the slot extends only through layers 6-10). A second controlled-depth slot 520 may extend all the way through the board (e.g., through layers 1-10). A third controlled-depth slot 530 may extend only through the top half of the board (e.g., only through layers 1-5).

Figure 6A:
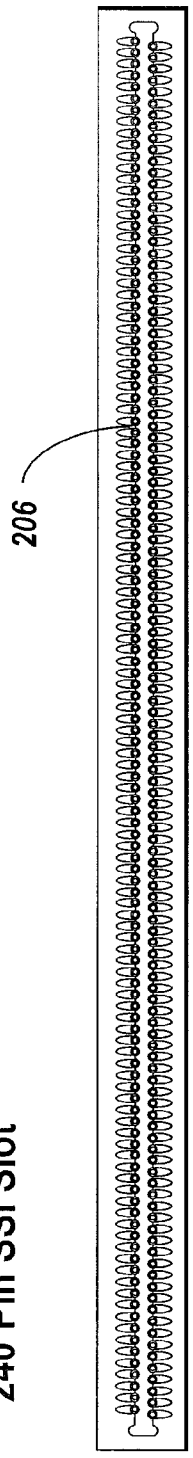
FIGS. 6A and 6B depict a CAD footprint for a slot according to exemplary embodiments of the present invention.
Figure 6B:
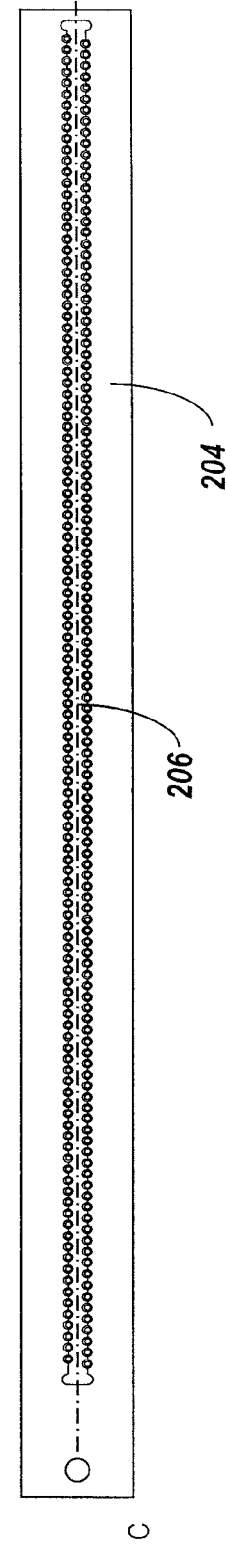

As noted above, the slot 206 may be sized and dimensioned in order to accommodate a technology module. For example, as shown in FIGS. 6A and 6B, the length of the slot 206 may preferably be 0.150 to 6.00 inches long.

Figure 7A:
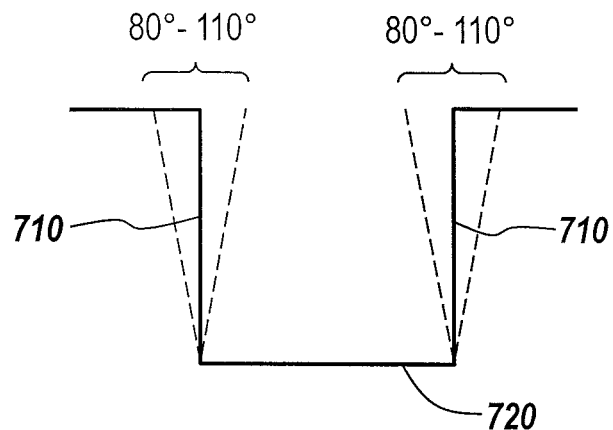
FIGS. 7A and 7B depict exemplary geometries for a slot according to exemplary embodiments of the present invention.
Figure 7B:
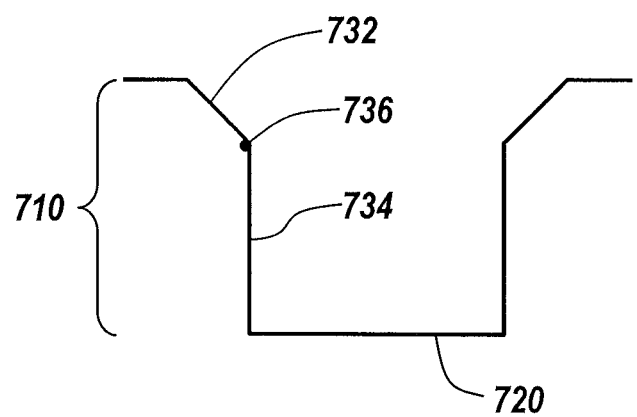

Further, as shown in FIGS. 7A and 7B, the walls 710 of the slot 206 need not be provided at 90 degree angles. Preferably, the walls 710 are provided at an angle extending from the bottom wall 720 of the slot 206 of between 80 degrees and 110 degrees. In some embodiments, as shown in FIG. 7B, the walls 710 may be provided at two or more angles. For example, a first wall 732 may extend down from the top of the slot 206 at a first angle of 30 degrees to ninety degrees, and the second wall 734 may meet the first wall 732 at an intermediate point 736 and extend down from the intermediate point 736 to the bottom wall 720 of the slot at a second angle. The second angle may be, for example, 80 degrees to 110 degrees.

Figure 8:
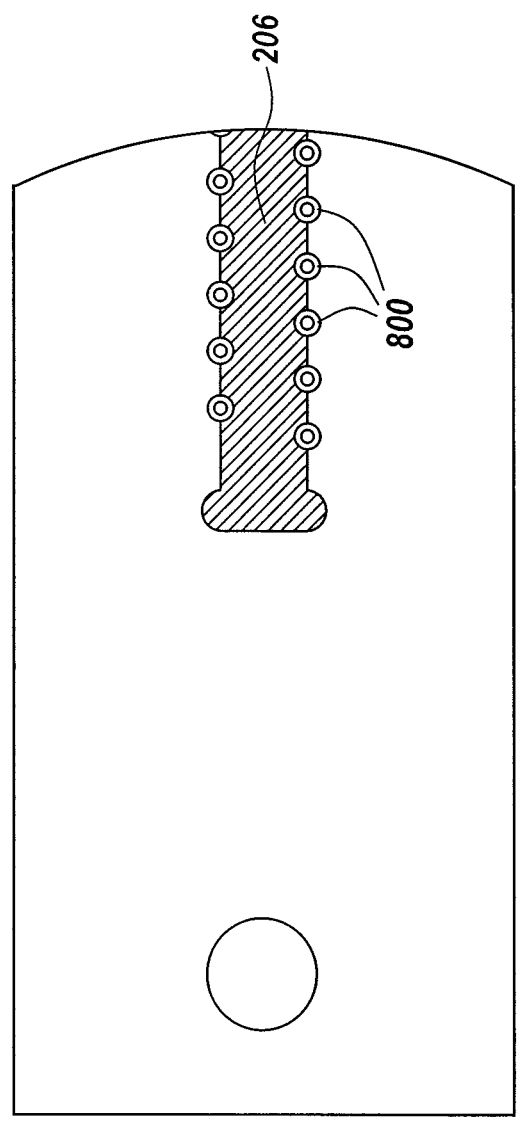
FIG. 8 provides exemplary sizes for various components of a slot according to exemplary embodiments of the present invention.
Figure 9:
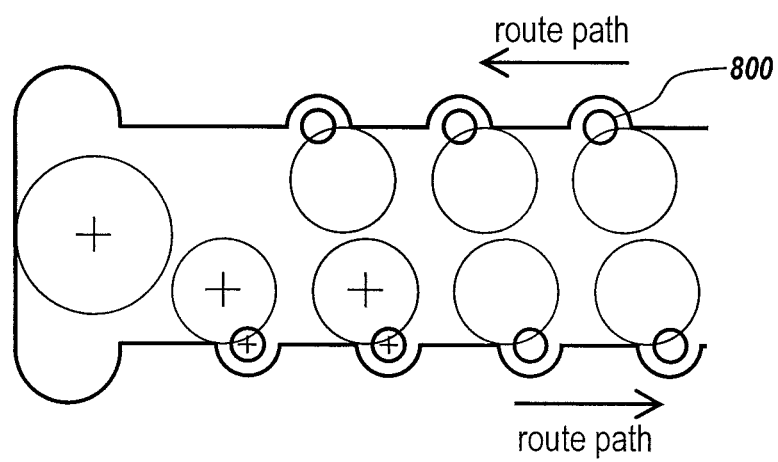
FIG. 9 is a drill plan depicting exemplary dimensions for a slot and interconnect features according to exemplary embodiments of the present invention.

FIGS. 8 and 9 provide further exemplary sizes for various components of a slot according to exemplary embodiments of the present invention. As shown in FIGS. 8 and 9, the slot 206 may include one or more interconnect features 800. The interconnect features 800 may be, for example, a ½ radial interconnect as described in detail with respect to FIGS. 10A-11B. Each of the interconnect features 800 may have a radius, such as 0.00295 inches to 0.0061 inches, and at least 2 of the ½ radial interconnect features may have different radiuses (allowing, e.g., for the connection of two or more different types of interconnects and/or pins for different purposes such as information transfer and the supplying of power).

The slot 206 may comprise substantially-½-radial plated through-holes to generate one or more solderable "D" interconnect features 800. The slot 206 may include 2 to 3000 ½ radial interconnect features 800. Although the through-holes are described as "½ radial" through-holes, it is not necessary that the through-holes be precisely in the shape of ½ of a circle.

Figure 10A:
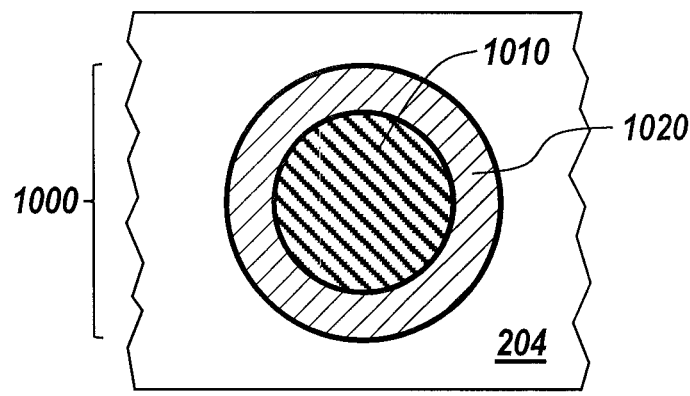
FIG. 10A depicts a plated-through hole suitable for securing an entity to a printed circuit board using solder.
Figure 10B:
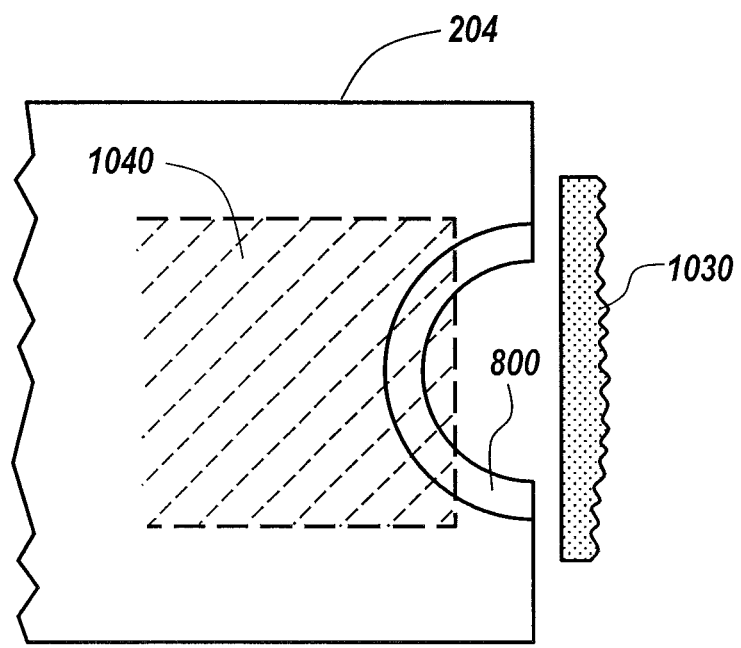
FIG. 10B depicts a ½ radial interconnect feature suitable for securing a technology module to a circuit board according to exemplary embodiments of the present invention.

It may be problematic or difficult to manufacture the ½ radial interconnect features directly as a semicircle. Accordingly, a simpler technique for forming the ½ radial interconnect features 800 may involve "breaking" a full radial plated thru-hole 100 in half. A plated thru-hole 1000 provided in a circuit board 204 is shown in FIG. 10A. The plated thru-hole 1000 includes an interior layer 1010 of lead and an exterior layer 1020 of solder. As shown in FIG. 10B, an exemplary ½ radial interconnect feature 800 suitable for use with exemplary embodiments of the present invention may be formed as one-half of a plated thru-hole 1000. The interconnect feature 800 need not be perfectly round, but may also be oval or have multiple rounded protrusions.

The ½ radial interconnect feature 800 may be provided by forming a full radial interconnect feature such as a plated through hole 1000, and breaking the full radial interconnect feature in half, for example using a router bit. The router bit may be rotated in a first direction and may approach the full radial interconnect feature from a first side in order to form a break in the full radial interconnect feature on the first side. Then, the direction of the router bit may be reversed, and the router bit may approach the full radial interconnect feature from a second side opposite the first side in order to form a second break in the full radial interconnect feature. Accordingly, half of the full radial interconnect feature may be removed in order to form a ½ radial interconnect feature 800.

The ½ radial interconnect feature 800 of the slot 206 may face a flat surface 1030 of an interconnect provided on the technology module seated in the slot 206. Solder 1040 may be provided to the ½ radial interconnect feature 800 using a solder mask in order to secure the technology module in the slot 206.

The technology module is preferably secured in the slot 206 using solder, and more preferably tin-lead solder. If tin-lead solder is used, the interconnects (e.g., "fingers" below) of the technology module may also include or be made up of tin-lead. Accordingly, when the tin-lead solder makes contact with the tin-lead interconnects of the technology module, an extremely secure connection can be realized. Alternatively, other securing means such as epoxy may be used to secure the technology module in the slot 206.

The technology module may be secured to one or more internal pads and anti-pads of the circuit board. An internal signal pad may have a size, for example, of 0.020 inches, while an internal anti-pad may have a size of 0.028 inches. External solder pads may be elongated to provide a robust solder fillet connection between the technology module and circuit board.

Figure 11A:
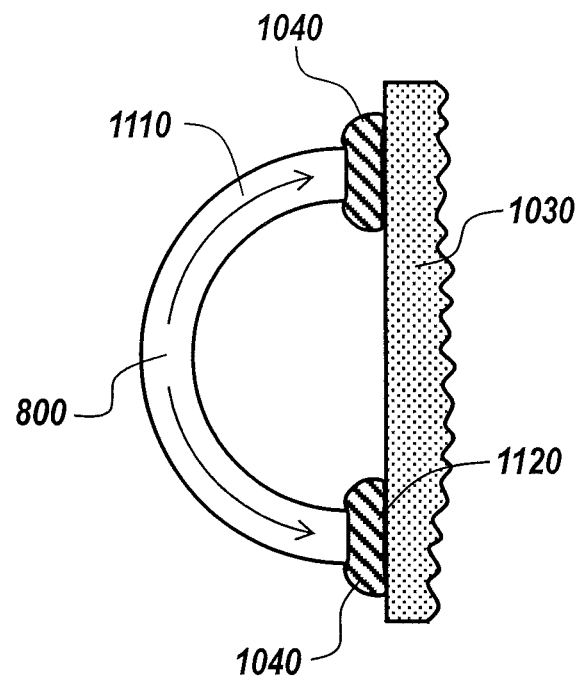
FIGS. 11A and 11B depict actions of gravity and surface tension which are leveraged to secure a technology module to a circuit board according to exemplary embodiments of the present invention.

For example, as shown in FIG. 11A, the solder may follow a path 1110 down the ½ radial interconnect feature 800 as encouraged by gravity. When the solder approaches and touches the flat surface 1030 of the interconnect, surface tension 1120 may encourage the solder 1040 to adhere to the flat surface 1030 of the interconnect.

Figure 11B:
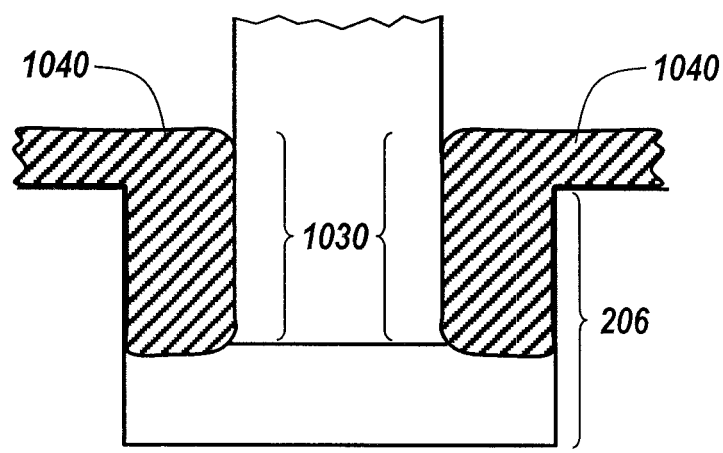

Due to the actions of gravity and surface tension, the solder 1040 may attach to the flat surface 1030 of the interconnect without approaching the bottom of the slot 206, as shown in FIG. 11B. This may allow for an interconnect to be provided on the bottom of the slot 206 in addition to the sides of the slot 206, as shown in FIG. 12A.

Figure 12A:
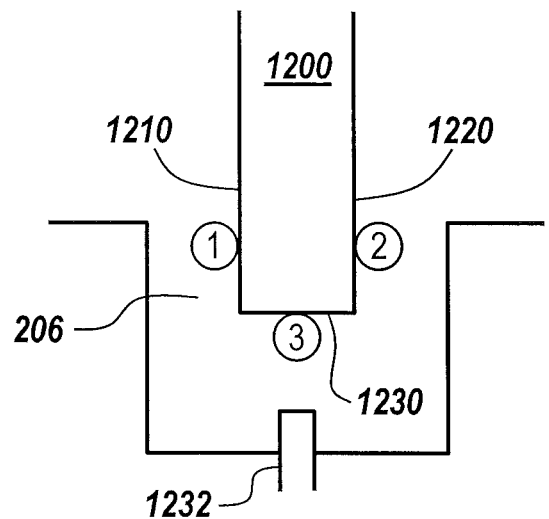
FIGS. 12A and 12B depict exemplary interconnect locations for a technology module suitable for use with exemplary embodiments of the present invention.

FIG. 12A depicts an exemplary technology module 1200 as shown from the side, and further illustrates locations on the technology module 1200 suitable for placing interconnects. For example, first and second interconnect locations 1210, 1220 are provided on respective sides of the technology module 1200. A third interconnect location 1230 is provided on the bottom of the technology module 1200. The third interconnect location 1230 may connect to an interconnect 1232 provided on the bottom wall of the slot 206.

Figure 12B:
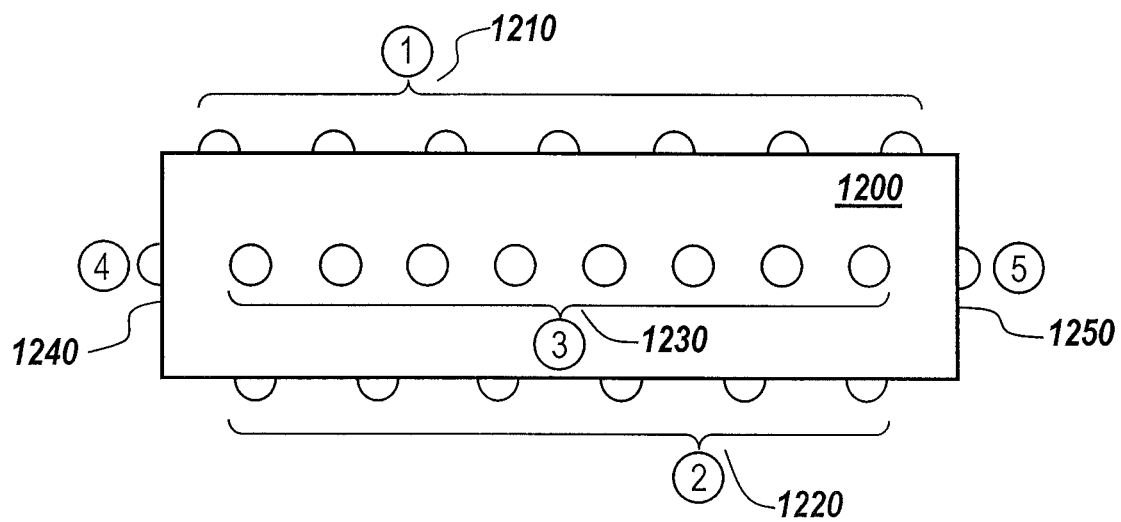

In addition, interconnects may be provided on the front and back of the technology module 1200. For example, as shown in FIG. 12B, a fourth interconnect location 1240 may be provided on the front of the technology module 1200, and a fifth interconnect location 1250 may be provided on the back of the technology module 1200.

Figure 13:
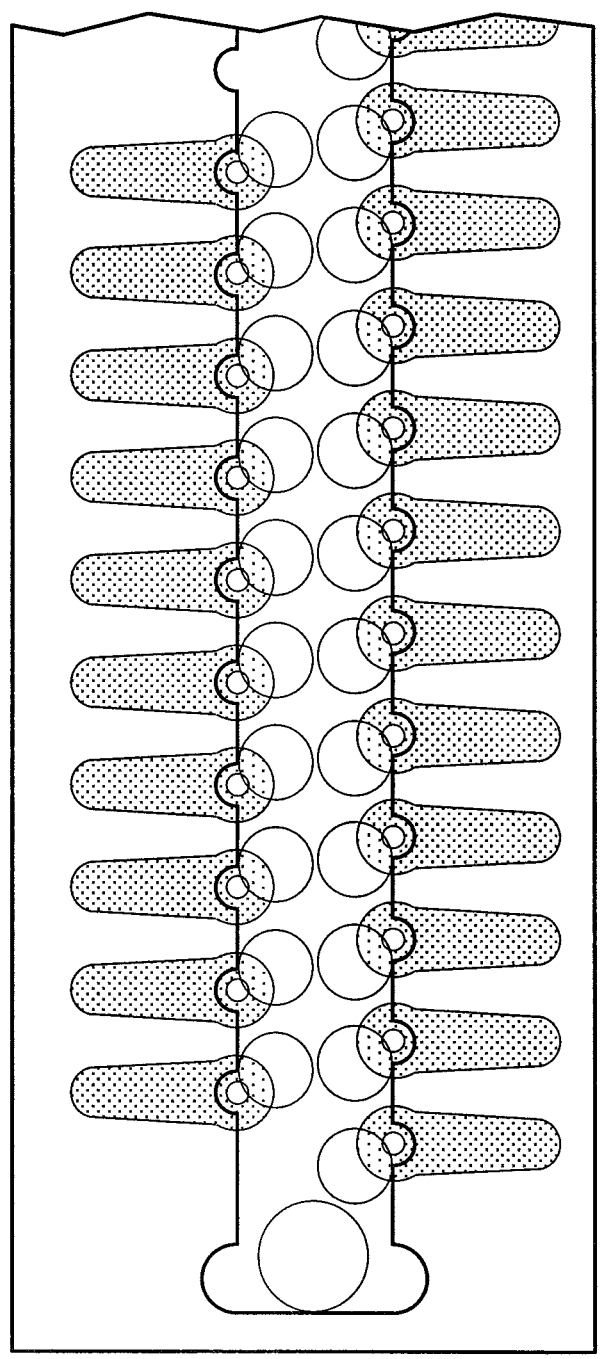
FIG. 13 depicts a geometry of a slot according to exemplary embodiments of the present invention.

FIG. 13 depicts a geometry of a solder pad for a slot 206 according to exemplary embodiments of the present invention. An internal signal pad may have a size, for example, of 0.020 inches, while an internal anti-pad may have a size of 0.028 inches. External solder pads may be elongated to provide a robust solder fillet connection between the technology module and circuit board.

Figure 14:
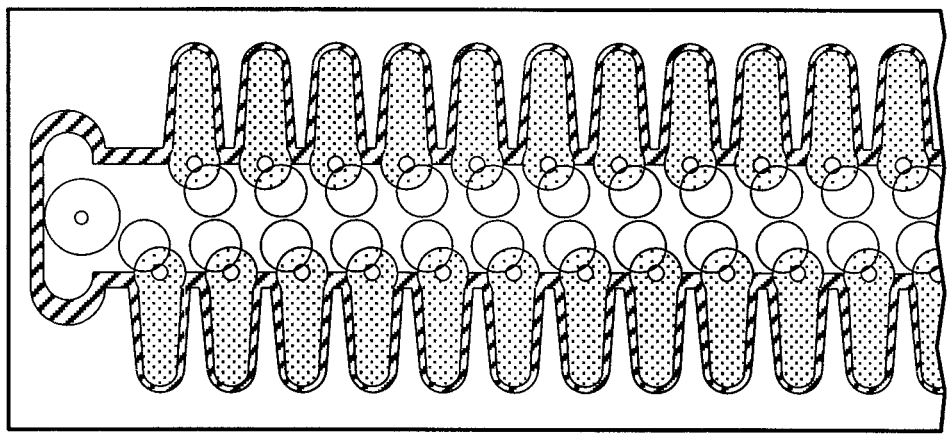
FIG. 14 is a solder mask for soldering a technology module into a slot according to exemplary embodiments of the present invention.
Figure 15:
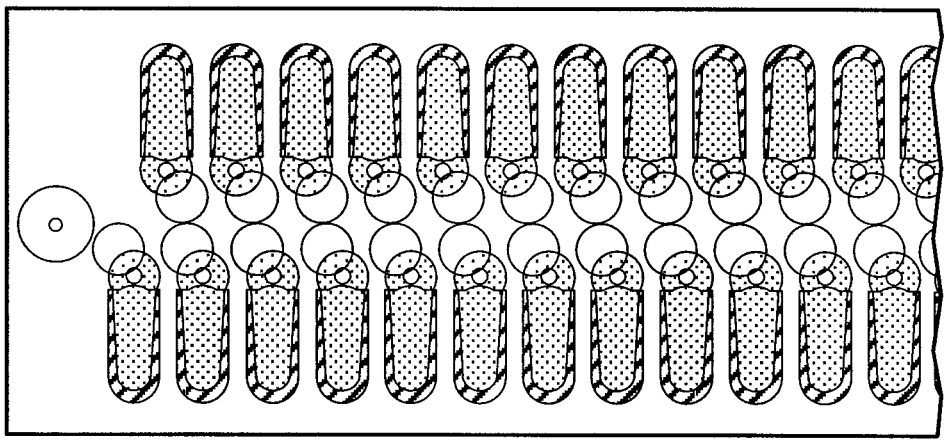
FIG. 15 is a paste mask for solder paste suitable for securing a technology module into a slot according to exemplary embodiments of the present invention.

The ½ radial interconnect features 800 may be used to secure a solderable technology module 1200 in the slot 206. For example, FIG. 14 is an exemplary solder mask for soldering a technology module into a slot, while FIG. 15 is an exemplary paste mask for solder paste suitable for securing a technology module into a slot.

Figure 16:
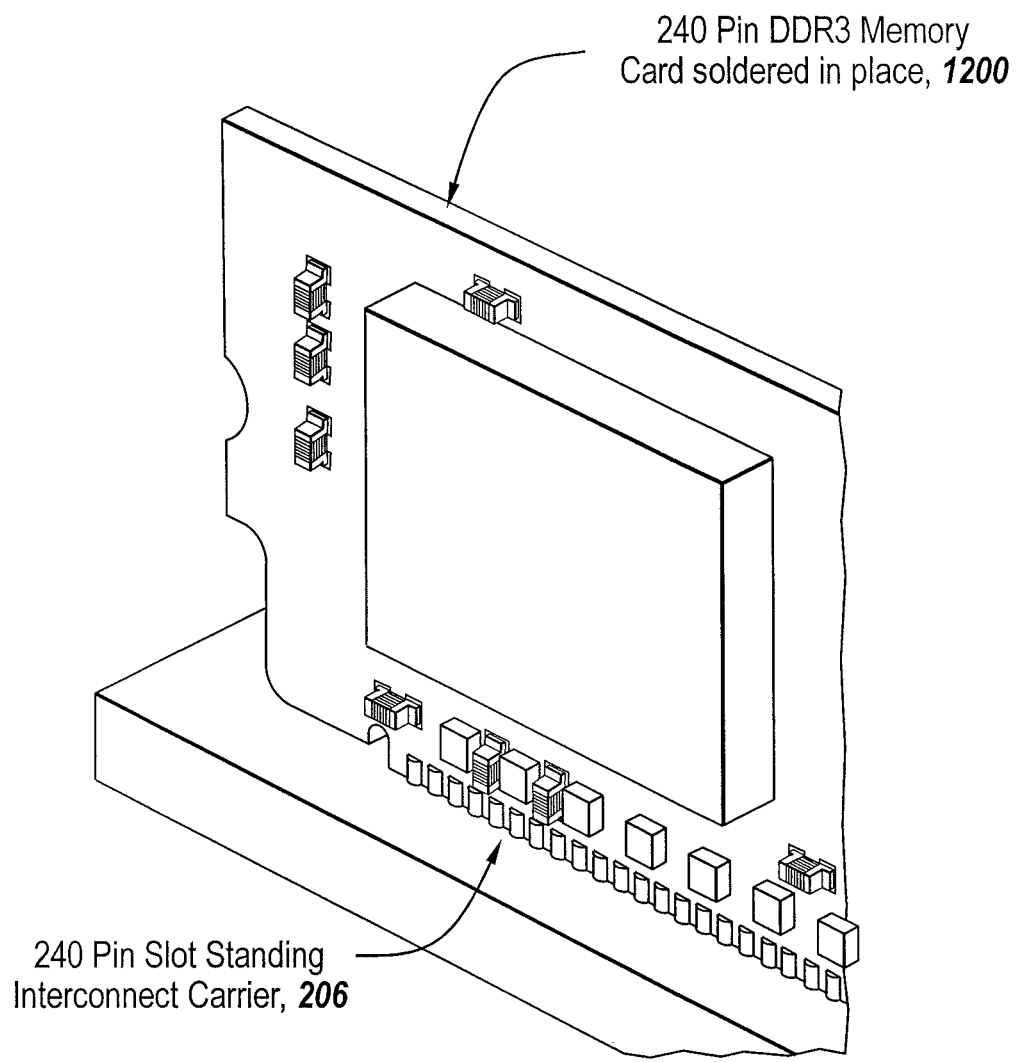
FIG. 16 depicts a solderable technology module soldered into place in a slot according to exemplary embodiments of the present invention.

FIG. 16 shows an exemplary technology module 1200 secured in the slot. The technology module 1200 may be, for example, a memory device, power device such as a Point of Load Supply (POLS), security device or anti-tamper device, capacitance device, or other type of chip such as a Field Programmable Gate Array (FPGA). The solderable technology module 1200 is depicted in more detail in FIGS. 17 and 18.

Figure 17:
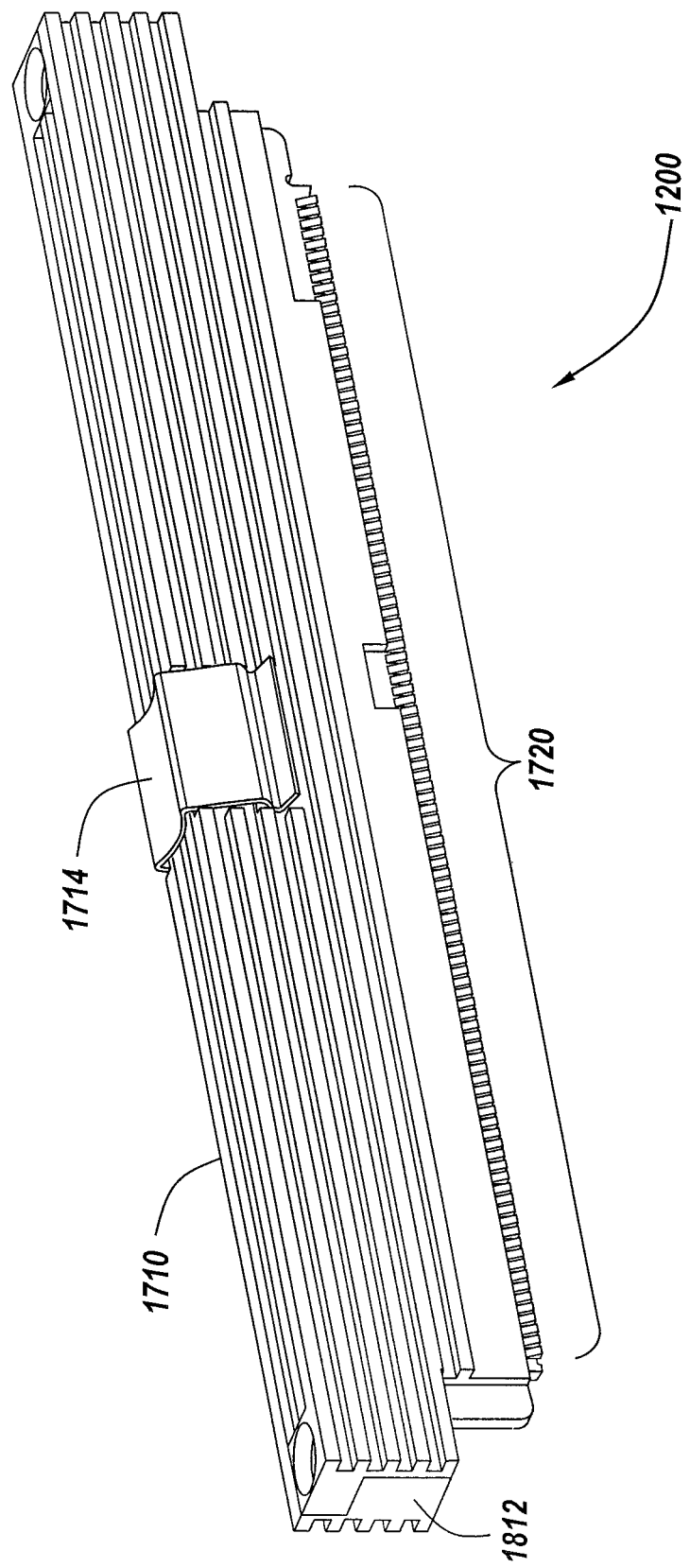
FIG. 17 depicts an exemplary solderable technology module suitable for use with exemplary embodiments of the present invention.
Figure 18:
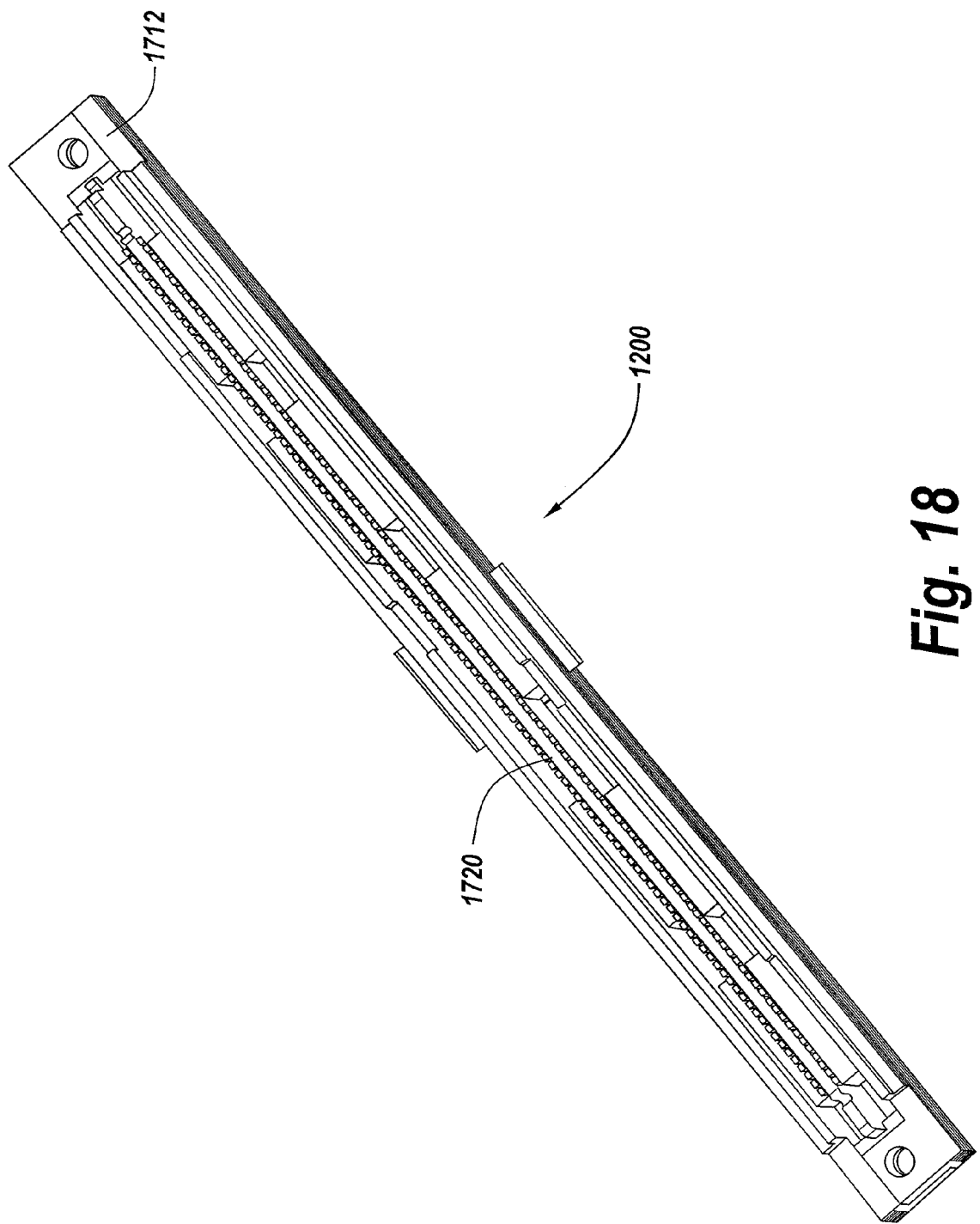
FIG. 18 is a bottom view of a solderable technology module suitable for use with exemplary embodiments of the present invention.

As shown in FIGS. 17 and 18, the solderable technology module 1200 may include a body 1710. The body 1710 may support one or more components for providing the functionality of the technology module 1200. For example, if the technology module 1200 is a memory module, the components may be memory components. In the case of a memory module, the memory module may include 1 GB to 1000 GB of memory split between the memory components. The components may also include anti-tamper security features for preventing one or more of the components from being modified by an outside user.

The body 1710 may be covered by a casing 1712 that is secured in place by a clip 1814. In total, the module may be 0.010 inches to 0.125 inches thick.

On the side of the technology module 1200 that is secured to the circuit board 204, one or more interconnects 1720 may be provided. The interconnects 1720 may be, for example, fingers extending from the body 1810 of the technology module 1200. Each of the fingers may carry information to a corresponding interconnect of the circuit board 204. The technology module 1200 may include 200 to 300 solderable fingers. The fingers may include a flat face for receiving solder. The fingers may include tin-lead, and may be soldered into the slot using tin-lead solder.

Figure 19A:
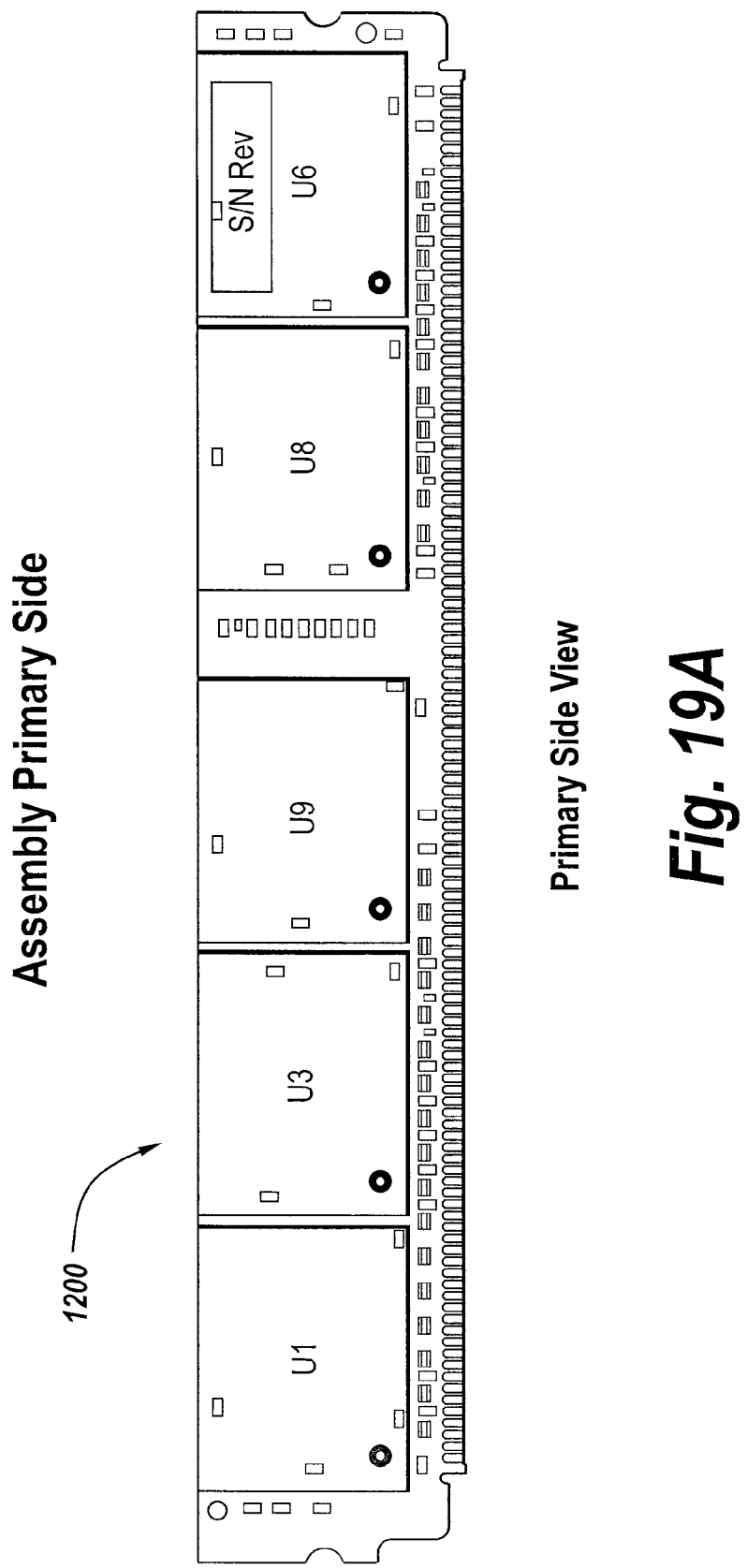
FIGS. 19A and 19B depict primary and secondary sides, respectively, of a solderable memory module according to exemplary embodiments of the present invention.
Figure 19B:
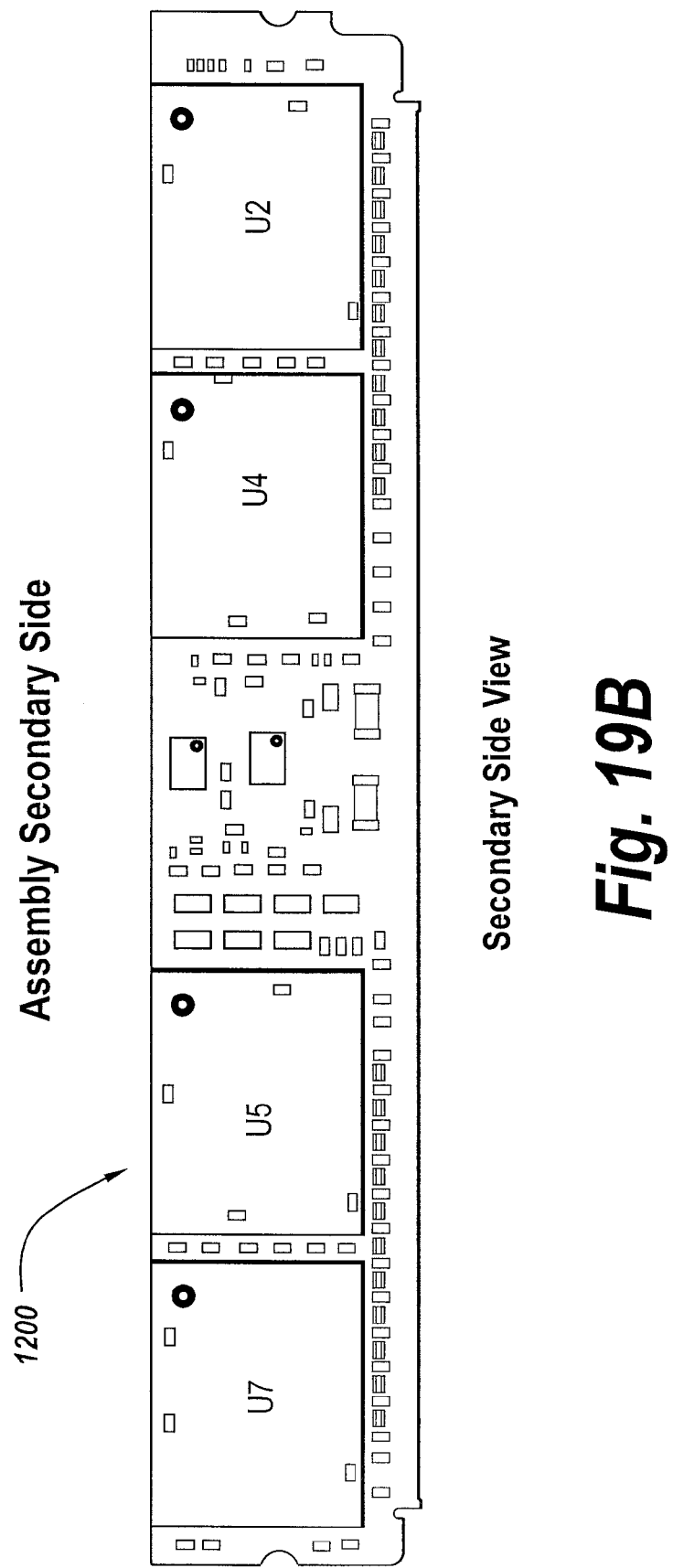

FIGS. 19A-19B depict primary and secondary sides, respectively, of a solderable memory module according to exemplary embodiments of the present invention and component placement on primary and secondary sides, respectively, of a solderable memory module according to exemplary embodiments of the present invention. The technology module 1200 may include several components attached to the primary and/or secondary side of the technology module. The technology module may be, for example, 0.150 to 6.00 inches long and 0.100 to 2.50 inches tall and 0.001 to 0.150 deep.

Figure 20:
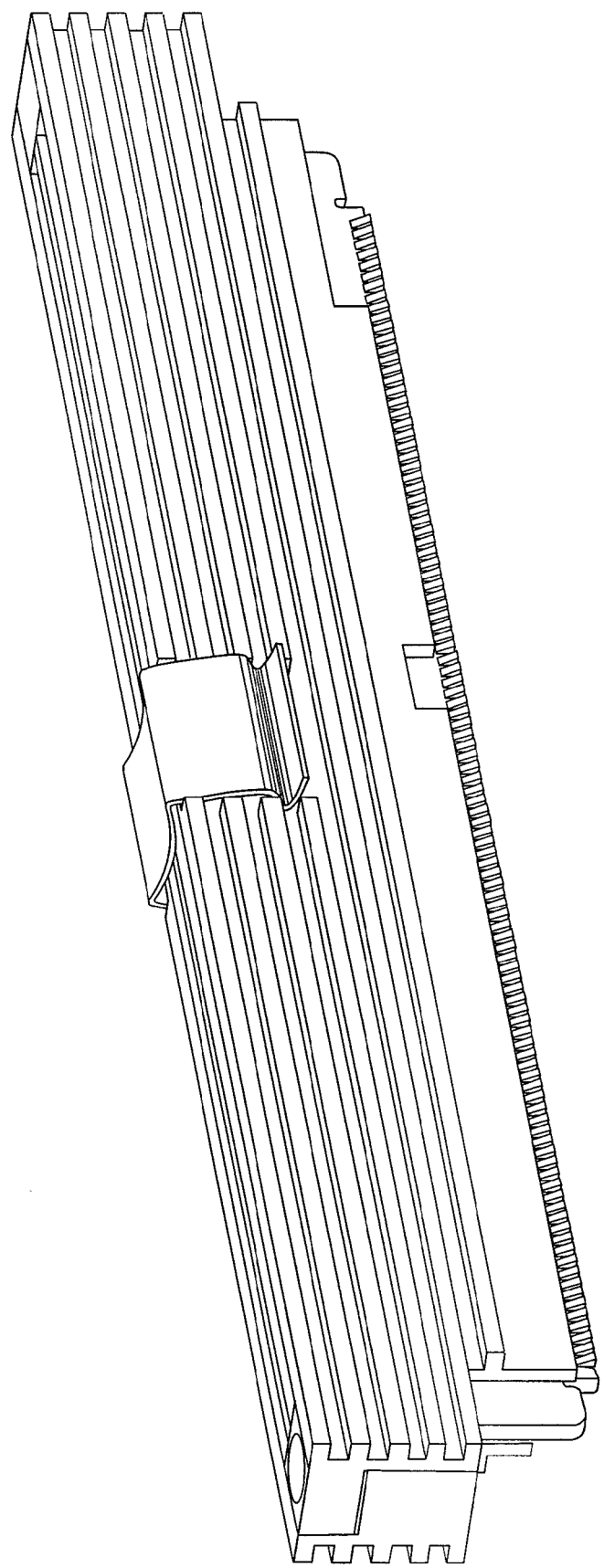
FIG. 20 is a wire mesh view depicting a solderable technology module secured in a slot according to exemplary embodiments of the present invention.
Figure 21:
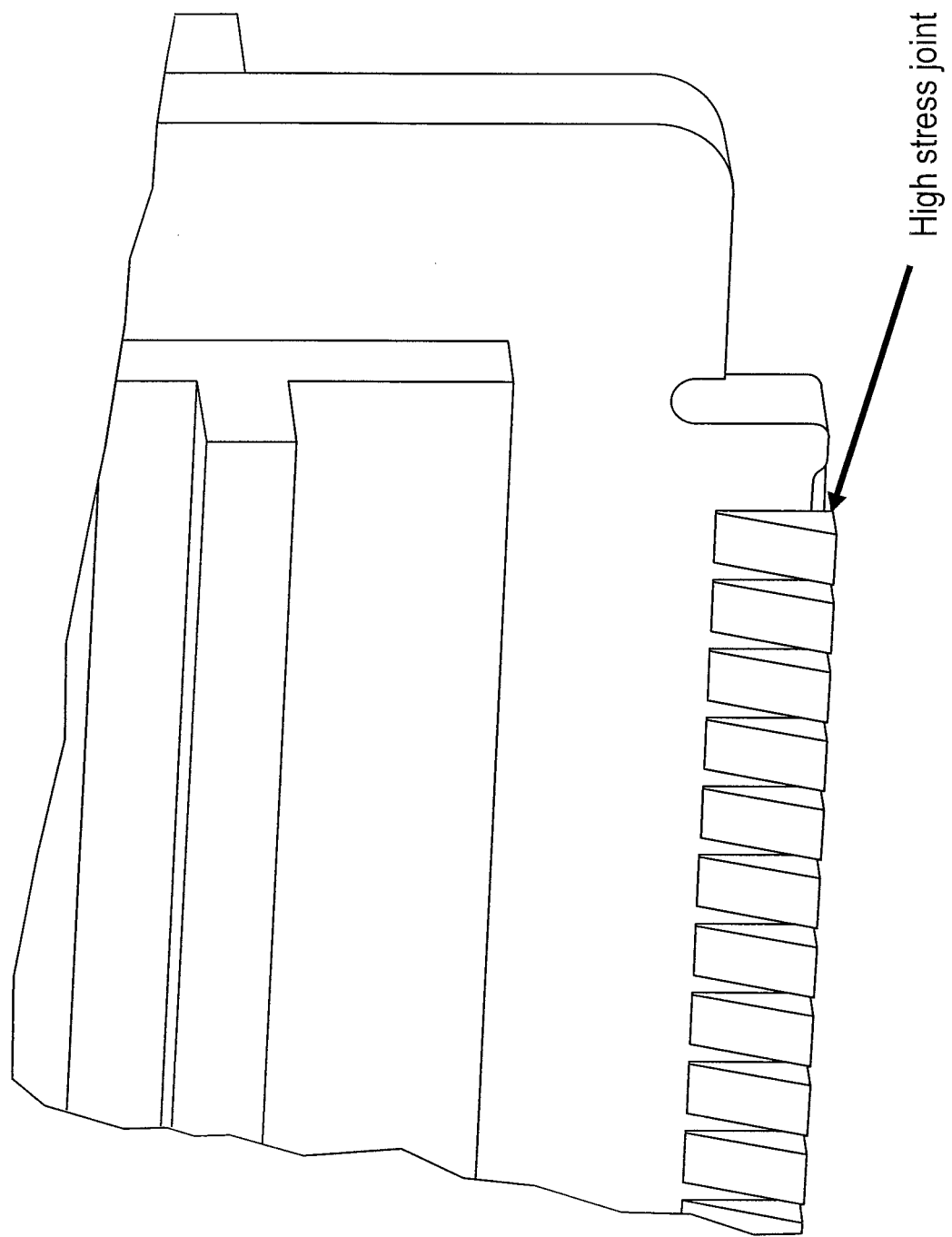
FIG. 21 is a close-up view depicting fingers of a solderable technology module secured in a slot according to exemplary embodiments of the present invention.

By securing the above-described technology module 1200 into the slot 206, a rugged circuit board/technology module system may be realized. FIGS. 20-21 depict a model of such a system which was tested in a simulation in order to predict a likely lifespan of the technology module 1200 in the circuit board 204. In the model, a wireframe mesh was constructed for the technology module 1200. As shown in the close-up in FIG. 21, a fine local mesh was constructed for the high stress joints among the fingers of the technology module 1200.

In order to estimate the solder fatigue life of a solder joint as depicted in FIGS. 20-21, several tests were performed, including a random vibration test, a sinusoidal vibration test, and a mechanical shock test. The results are shown in FIG. 22.

The random vibration test was performed in accordance with Based on Mil-STD-810F, Method 514.5 for 1 hour per axis on all 3 orthogonal axes at 11.66 GRMs, 0.1 $G^2$/Hz peak. The sinusoidal vibration test was based on MIL-HDBK-5400, and was performed for 1 hour per axis on all 3 orthogonal axes with a 75" displacement from 5-15 Hz and 10 G peak to peak from 15 to 2000 Hz. The mechanical shock test provided 3 shocks per axis in each direction (+/−), with 18 pulses total with a 50 Gs, 11 msec ½ sine pulse normal to the Z axis and 80 Gs 11 msec ½ sine pulses in-plane in the X&Y axis.

Figure 22:
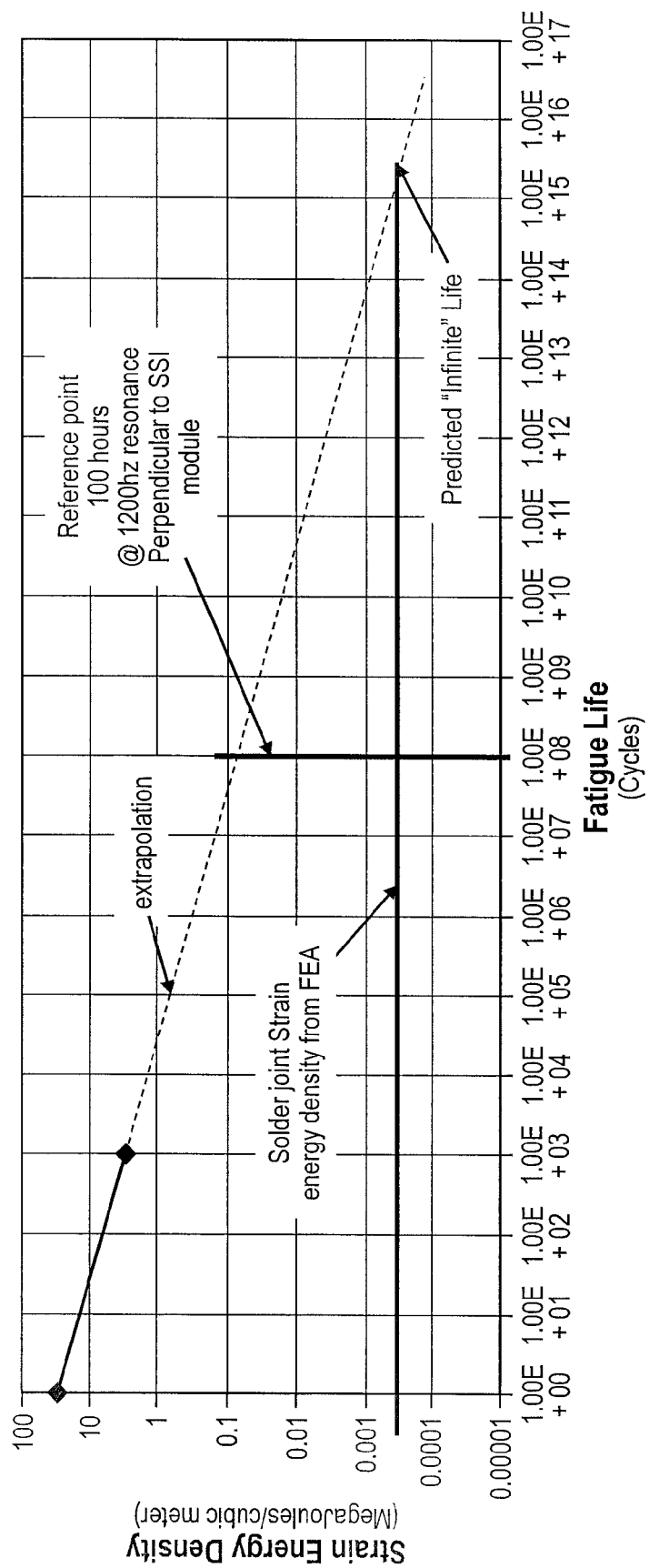
FIG. 22 is a graph depicting the results of the stress analysis of the module shown in FIGS. 20-21.

The quantitative results of the simulation are shown in FIG. 22. The results were mapped to an extrapolation of Park et al. (2002)'s fatigue life tests for very low stress reversal cycles in a random vibration environment. As a result of the extrapolation, it was concluded that the fatigue life of a solder joint for one of the fingers of the technology module 1200 was approximately $1.50 \times 10^{15}$ cycles. Because this lifespan dramatically exceeds the useful life of the circuit board/technology module system, the lifespan of the solder joint is deemed to be effectively "infinite."

As a result of these tests, it was determined that, due to the extremely high solder amount per square inch of interconnect, the presently described interconnects and interconnect features provide rugged structural support for the technology module 1200 in an air cooled module dynamic environment. Thus, this technology significantly reduces technology module fretting reliability issues, particularly those associated with high vibration environments.

Figure 23:
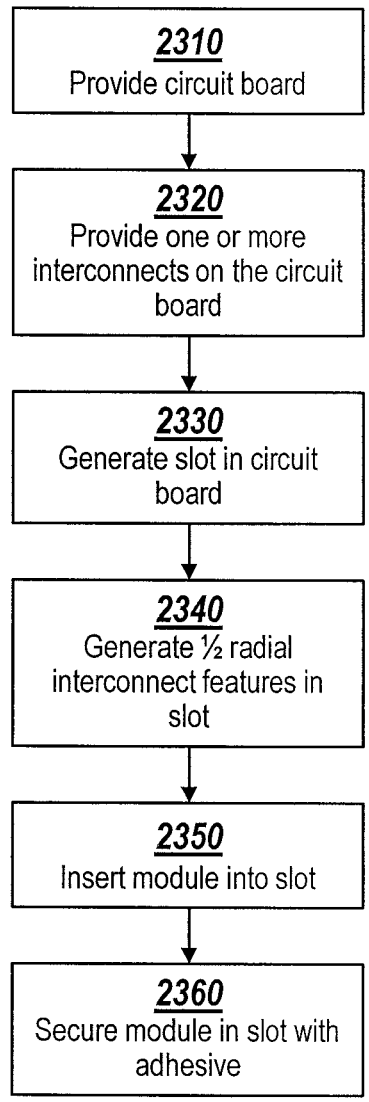
FIG. 23 is a flowchart depicting an exemplary process for producing a circuit board and technology module system according to exemplary embodiments of the present invention, where the technology module is secured in a slot of the circuit board.

In order to achieve such results, the present application also contemplates a method of manufacturing or producing a circuit board having a slot with a technology module secured therein. FIG. 23 is a flowchart depicting an exemplary process for producing a circuit board and technology module system according to exemplary embodiments of the present invention, where the technology module is secured in a slot of the circuit board.

At step 2310, a circuit board may be provided. The circuit board may be a printed circuit board having one or more layers. At step 2320, one or more interconnects may be provided on the circuit board, for example using surface mount technology.

At step 2330, a slot may be generated in the circuit board. The slot may be generated by milling the slot into the circuit board to a controlled depth. The slot may extend a portion of the depth of the circuit board, such as halfway. For example, the slot may extend at most ½ of a depth of the circuit board. If the circuit board includes, for example, 24 layers, in some embodiments the slot may extend to at most the 12$^{th}$ layer. The slot may be 0.010 inches to 0.250 inches wide and may extend 0.005 inches to 0.125 inches into the circuit board.

At step 2340, one or more ½ radial interconnect features may be generated on at least one side of the slot. The ½ radial interconnect features may be provided on 3-4 sides of the slot, and may further be provided on the bottom of the slot. The step of generating the one or more ½ radial interconnect features may include generating 2 to 3000 radial interconnect features. As noted above, the ½ radial interconnect features may be provided by producing full radial interconnect features such as a plated through-hole and "breaking" the full radial interconnect features in half.

At step 2350, a technology module may be inserted into the slot. For example, the technology module may be a memory module.

At step 2360, the technology module may be secured in a slot of the circuit board. For example, the technology module may be secured in the slot by providing an adhesive to the one or more ½ radial interconnect features of the slot to secure the module in the slot. The adhesive may be solder.

According to the above-described embodiments, a rugged circuit board system may be provided. The circuit board system may exhibit smaller dimensions than conventional circuit board systems in which an external apparatus is provided for securing a technology module in a slot.

The foregoing description may provide illustration and description of various embodiments of the invention, but is not intended to be exhaustive or to limit the invention to the precise form disclosed. Modifications and variations may be possible in light of the above teachings or may be acquired from practice of the invention. For example, while a series of acts has been described above, the order of the acts may be modified in other implementations consistent with the principles of the invention. Further, non-dependent acts may be performed in parallel. Further, although features and accessing classes have been described above using particular syntaxes, features and accessing classes may equally be specified using in different ways and using different syntaxes.

In addition, one or more implementations consistent with principles of the invention may be implemented using one or more devices and/or configurations other than those illustrated in the Figures and described in the Specification without departing from the spirit of the invention. One or more devices and/or components may be added and/or removed from the implementations of the figures depending on specific deployments and/or applications. Also, one or more disclosed implementations may not be limited to a specific combination of hardware.

No element, act, or instruction used in the description of the invention should be construed critical or essential to the invention unless explicitly described as such. Also, as used herein, the article "a" is intended to include one or more items. Where only one item is intended, the term "a single" or similar language is used. Further, the phrase "based on," as used herein is intended to mean "based, at least in part, on" unless explicitly stated otherwise. In addition, the term "user", as used herein, is intended to be broadly interpreted to include, for example, an electronic device (e.g., a workstation) or a user of a electronic device, unless otherwise stated.

It is intended that the invention not be limited to the particular embodiments disclosed above, but that the invention will include any and all particular embodiments and equivalents falling within the scope of the following appended claims.

The invention claimed is:

1. A circuit board comprising a slot for seating a technology module, the slot comprising:
   a depth, the depth of the slot extending a portion of a depth of the circuit board without extending through the entirety of the circuit board, wherein the slot is substantially 0.005 inches to 0.125 inches deep; and
   one or more ½ radial interconnect features, the ½ radial interconnect features provided on at least one side of the slot, wherein each of the radial interconnect features has a radius of 0.00295 inches to 0.0061 inches.

2. The circuit board of claim 1, wherein the radial interconnect features are plated through-holes.

3. The circuit board of claim 1, wherein the slot comprises 2 to 3000 ½ radial interconnect features.

4. The circuit board of claim 1, wherein the ½ radial interconnect features are provided on 3 to 4 sides of the slot.

5. The circuit board of claim 1, wherein each of the ½ radial interconnect features has a radius, and at least two of the ½ radial interconnect features have different radiuses.

6. The circuit board of claim 1, wherein the slot further comprises an interconnect feature provided on the bottom of the slot.

7. The circuit board of claim 1, wherein the slot is substantially 0.010 inches to 0.250 inches wide.

8. The circuit board of claim 1, further comprising an adhesive provided to the one or more ½ radial interconnect features.

9. The circuit board of claim 1, wherein the adhesive is solder.

10. A circuit board assembly, the assembly comprising:
    a circuit board;
    a slot internal to the circuit board, the slot comprising one or more ½ radial interconnect features, the ½ radial interconnect features provided on at least one side of the slot; and a module provided in the slot wherein the module comprises 200 to 300 solderable fingers that connect with the radial interconnect features.

11. The module of claim 10, wherein the module is substantially 0.010 inches to 0.125 inches thick.

12. The system of claim 10, wherein:
the module is secured to the circuit board using solder;
the fingers comprise tin-lead; and
the solder comprises tin-lead solder.

13. The system of claim 10, wherein the fingers have at least one flat surface for receiving solder.

14. The system of claim 10, wherein the module is provided with anti-tamper security features.

15. The system of claim 10, wherein the module is a memory module.

16. The system of claim 15, wherein the memory module includes 1 GB to 1000 GB of memory.

* * * * *